United States Patent [19]
Lam

[11] Patent Number: 5,541,547
[45] Date of Patent: Jul. 30, 1996

[54] TEST GENERATOR SYSTEM FOR CONTROLLABLY INDUCING POWER PIN LATCH-UP AND SIGNAL PIN LATCH-UP IN A CMOS DEVICE

[75] Inventor: Chung Lam, Fremont, Calif.

[73] Assignee: Sun Microsystems, Inc., Mountain View, Calif.

[21] Appl. No.: 434,067

[22] Filed: May 3, 1995

[51] Int. Cl.⁶ .................................................. G06F 7/556
[52] U.S. Cl. ...................... 327/355; 371/22.3; 371/22.5; 348/126; 382/149; 324/763; 250/358.1
[58] Field of Search ..................................... 327/355, 361, 327/18, 20, 23; 361/91, 101, 111; 257/138, 139, 142; 324/763; 371/22.3, 22.5; 348/126; 382/149

[56] References Cited

U.S. PATENT DOCUMENTS

| | | | |
|---|---|---|---|
| 4,532,534 | 7/1985 | Ford et al. | 357/23.4 |
| 4,633,283 | 12/1986 | Avery | 357/23.13 |
| 4,672,407 | 6/1987 | Nakagawa et al. | 357/23.4 |
| 4,870,530 | 9/1989 | Hurst et al. | 361/91 |
| 5,170,239 | 12/1992 | Hagino | 257/139 |
| 5,326,994 | 7/1994 | Giebel et al. | 257/174 |
| 5,391,898 | 2/1995 | Hagino | 257/139 |

Primary Examiner—Tiimothy P. Callahan
Assistant Examiner—Kenneth B. Wells
Attorney, Agent, or Firm—Flehr, Hohbach, Test, Albritton & Herbert; Michael A. Kaufman, Esq.

[57] ABSTRACT

A latch-up pulse generator system includes a latch-up pulse generator coupled to first and second power supplies, for outputting JEDEC-standardized first and second output pulse trains. The generator includes a master clock, digital frequency dividers, and digitally controlled delay circuitry for outputting the two pulse trains. The first pulse train is a square-wave signal with a repetition rate of about two seconds. The second pulse train has a pulse width that is digitally controllable between about 0.2 μs and 5 μs. The delay between the fall-time of the second pulse train and the fall-time of the first pulse train is variably controlled between about 1 μs and one second in 1 μs steps. The amplitude and current output of each pulse train may range from 0 to perhaps 15 VDC at a current level of about 5 A. For power pin latch-up testing, the two pulse trains are combined to produce a composite pulse train. Signal and/or power pins of a CMOS device under test may be analyzed. Digital control permits a user to halt latch-up at any point in the latch-up phenomenon for purposes of observation, analysis and recordation. Preferably a generic emission microscope is used to observe the device under test.

21 Claims, 5 Drawing Sheets

5,541,547

TEST GENERATOR SYSTEM FOR CONTROLLABLY INDUCING POWER PIN LATCH-UP AND SIGNAL PIN LATCH-UP IN A CMOS DEVICE

FIELD OF THE INVENTION

The present invention relates generally to failure analysis of complementary-metal-oxide-semiconductor ("CMOS") transistors, and more particularly to equipment for analysis of latch-up failure in CMOS integrated circuits.

BACKGROUND OF THE INVENTION

Integrated circuits ("ICs") fabricated with CMOS transistors advantageously consume little DC current and are readily produced. Unfortunately, however, CMOS transistors are susceptible to a phenomenon known as "latch-up".

By way of example, FIG. 1A depicts a generic CMOS inverter 10 coupled between the upper and lower power supplies, VDD and VSS. The inverter includes a P-type or PMOS transistor M1 and an N-type or NMOS transistor M2. The gates of M1 and M2 are coupled together to an input port that receives a $V_{IN}$ signal, and the source of M1 and the drain of M2 are coupled together to an output port that provides a $V_{OUT}$ signal that is an inversion of VIN. The drain of M1 is coupled to VDD and the source of M2 is coupled to VSS, which is commonly ground.

Under normal operation, $V_{OUT}$ is an inverted version of VIN, and under DC or static conditions, essentially no dissipation within the transistors occurs since when M1 is turned on, M2 is turned off, and vice versa. Under static load conditions, the current $i_o$ provided by the upper power supply $V_{DD}$ typically is limited to approximately $V_{DD}/R_L$, where $R_L$ is the resistive component of the load being driven by inverter 10.

FIG. 1B is a simplified cross-section of a P-type substrate upon which inverter 10 has been fabricated. PMOS transistor M1 is fabricated with an N well and includes two spaced-apart P+ regions that define M1's source and drain, and a gate that overlies and is separated from the spaced-apart region by a thin oxide layer. NMOS transistor M2 includes two spaced-apart N+ regions that define M2's source and drain, and a gate that overlies and is separated from the spaced-apart region by a thin oxide layer.

As shown in FIG. 1B, M1's P+ drain region is coupled to VDD, M1's P+ source region is coupled to VOUT and to M2's N+ drain region, and the gates of M1 and M2 are coupled together to receive a VIN signal. M2's N+ source region is coupled to the lower power supply VSS. While the above-described configuration defines a series-coupled PMOS and NMOS transistor pair, the various doped regions also define parasitic bipolar transistors Q1 and Q2, drawn in phantom. It is the inherent presence of Q1 and Q2 that give rise to latch-up failure in CMOS circuits such as inverter 10.

PNP bipolar transistor Q1 is defined by a P+ doped emitter region (e.g., the P+ drain of M1), an N doped base region (e.g., the N well containing PMOS transistor M1), and a P doped collector region (e.g., the P substrate). NPN bipolar transistor Q2 is defined by an N doped collector region (e.g., the N well containing PMOS transistor M1), and P doped base region (e.g., the P substrate), and an N doped emitter region (e.g., the N+ source of NMOS transistor M2). Similarly, conductive paths may exist defining resistors R1 and R2, respectively coupled across Q1's emitter-base junction, and across Q2's emitter base junction.

Latch-up can occur during operation of inverter 10 when parasitic bipolar transistors Q1 and Q2 are both forward biased, and thus turned-on. The resultant NPN-PNP configuration will be recognized as being equivalent to a silicon-controlled rectifier ("SCR"). Like a true SCR, once the parasitic bipolar transistors Q1–Q2 turn-on, they can only be turned-off by removing all operating power from inverter 10.

Latch-up current from VDD through Q1, Q2 to VSS can readily reach an ampere or so, within a few hundred nanoseconds or less. As such, latch-up current is far in excess of the nominal load current $i_o$ associated with inverter 10. The resultant high latch-up current flow and attendant heat can damage or destroy inverter 10 (or other CMOS circuit) before it is even known to interrupt the power supply. Of course, in actual applications, interrupting operating power to inverter 10 will also interrupt operating power to many other ICs as well, further hampering performance of the system containing the ICs.

In designing inverter CMOS circuits such as inverter 10, it is known to reduce latch-up by keeping the current gain β for bipolar transistors Q1 and Q2 low, and by keeping the bulk resistance of the substrate high. However in designing new CMOS ICs to avoid latch-up, the rapidity with which latch-up destruction can occur hampers the analysis procedure. It is to be understood that the inverter of FIG. 1A is but one example of a CMOS-implemented circuit that is susceptible to latch-up. However, non-inverter CMOS circuits can also be susceptible to such damage.

It will be appreciated from FIG. 1B that latch-up is characterized by forward biased emitter-base junctions for the parasitic bipolar transistors Q1 and Q2. Under high current latch-up conditions, these emitter-bias junctions emit photons. These photo emissions can be examined using an emission microscope, in an attempt to analyze the latch-up problem with a view to modifying the IC layout or design to avoid future latch-up.

Understandably, it is difficult to intentionally cause latch-up in a predictable fashion for purposes of observing and analyzing the phenomenon. For example, in testing signal pins of a CMOS device for latch-up, it is necessary to provide a test generator that outputs a first pulse train that is coupled to the power pin of the device under test, and a second pulse train that is coupled to a signal pin on the device under test. During a time when the first pulse train is "high", a pulse from the second pulse train can trigger latch-up.

In power pin testing, a single composite pulse train is coupled to the power pin of the CMOS device under test. When it is not "low", the composite pulse train has a first voltage level approximating a level of the first pulse train. Superimposed on a portion of the first voltage level is a trigger pulse having a higher voltage level approximating the trigger pulse level of the second pulse train.

One partial solution to latch-up testing was put forth by the Japanese Hamamatsu company. Hamamatsu provided a system that included a dedicated digital delay and pulse generator (their model DG535), a latch-up pulse generator, and a gate controlled camera. This system output first and second pulse trains for signal pin latch-up testing, but did not provide a composite pulse for power pin testing. The second pulse train (the trigger pulse train) was apparently output by charging and discharging one or more capacitors. This use of capacitors had the unfortunate result that the pulse width of the trigger pulse could not readily be user controlled. The system did, however, allow variation in the delay between the trigger pulse and the first pulse train, and in the amplitude of the pulse trains.

This system was designed for use with a Hamamatsu emission microscope whose images of a CMOS device in latch-up would be photographed in synchronism with operation of the gate controlled camera. The DG535 controllably output synchronization trigger pulses to the latch-up generator and to the camera control gate. Apparently under certain conditions, signal-pin latch-up in the device under test could be induced, whereupon the gate controlled camera could record emission microscope images for later analysis of any latch-up.

In short, the Hamamatsu system was essentially dedicated for use with the gate controlled camera, and associated emission microscope. The system did not meet Joint Electronic Device Engineering Committee ("JEDEC") standards, in that there was no provision for power pin latch-up testing. Although signal pin testing was possible, essentially no user control over the width of the second pulse train (trigger pulse) was provided. Finally, the cost of the Hamamatsu apparatus was relatively high, as much as $5,000 for the SG535 digital delay generator alone.

Thus, there is a need for a latch-up pulse generator system that outputs pulses for power pin testing as well as signal pin testing of a CMOS device, according to present JEDEC standards. Such generator should permit user control over width, delay, and amplitude of the trigger pulse to promote latch-up sensitivity evaluation.

The system should be self-contained and permit latch-up analysis with essentially any type of emission microscope. Finally, such system should cost substantially less than several thousand dollars to implement.

The present invention discloses such a system.

SUMMARY OF THE INVENTION

A latch-up pulse generator system includes a latch-up pulse generator coupled to first and second power supplies, for outputting first and second output pulse trains. The generator includes a master clock, digital frequency dividers, and digitally switchable delay circuitry for outputting the two pulse trains. The system meets the newly proposed JEDEC "IC Latch-up Test" standard protocol and can test signal pins and/or power pins for a CMOS device under test. Signal pin testing uses both pulse trains, whereas power pin testing superimposes the two pulse trains to create a composite pulse train.

The first pulse train is a square-wave signal with a repetition rate of about two seconds, an amplitude that is user adjustable from 0 VDC to perhaps 15 VDC at a current level of about 5 A. The second pulse train (the trigger pulse) has a pulse width that is digitally switchable between about 0.2 µs, 1.5 µs, and 5 µs. The delay between the fall-times of the second pulse train and the first pulse train (e.g., the time during which latch-up may be induced) is switchably controlled between about 1 µs and 1 second, preferably in 1 µs steps. The amplitude and current output of the second pulse train is similarly user adjusted from 0 VDC to perhaps 15 VDC at a current level of about 5 A. To achieve the voltage and current levels stated, the first and second pulse trains switch solid state relays coupled to the first and second power supplies. For power pin testing, a third pulse train, a composite formed by super-imposing the first and second pulse trains, is used.

The pulse width and delay associated with the second pulse train are digitally controllable. This permits a user to halt latch-up at any point in the latch-up phenomenon for purposes of observation, analysis and recordation. This user control allows the present invention to provide a measure of sensitivity of the device under test to latch-up. Preferably a generic emission microscope is used to observe the device under test. Because the latch-up phenomenon may be repeated, the emission microscope output may be photographed using conventional techniques.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 2A:
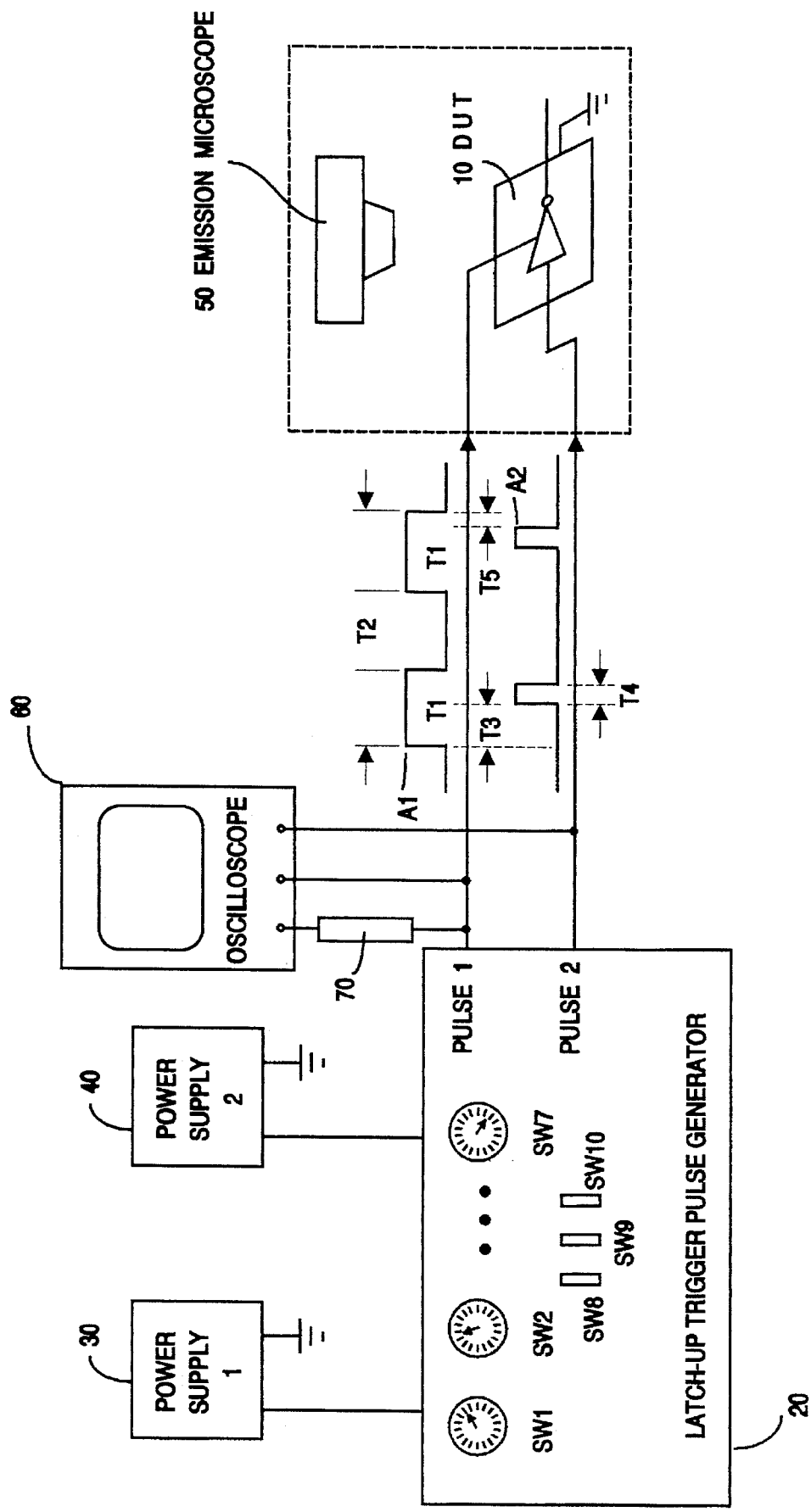
FIG. 2A is a block diagram of a latch-up pulse generator system outputting first and second pulse trains for signal pin testing, according to the present invention.

FIG. 2A depicts a system for controllably creating onset and progression of signal pin latch-up in a CMOS device under test ("DUT") 10. The system includes the present invention 20, a latch-up trigger pulse generator, that is coupled to preferably two independent power supplies 30, 40. Each power supply can controllably output a DC voltage variable in amplitude A1, A2 from 0 to perhaps 15 V, at current levels of about 5 A, although other voltages and current ratings could be used. While not shown in FIG. 2A, the system also includes a low voltage power supply, typically about 5 VDC, that powers the components comprising generator 20.

Generator 20 outputs first and second pulse trains (PULSE 1, PULSE 2) that meet JEDEC latch-up testing standards. In general, signal pin testing (e.g., input pin, output pin, input/output pins) of DUT 10 will use both pulse trains. As will be described with respect to FIG. 2B, for power pin testing of DUT 10, a pulse train comprising the superposition of PULSE 1 and PULSE 2 is used.

In signal pin testing, PULSE 1 typically is set to an amplitude A1 approximating the nominal operating voltage for DUT 10. For example, if DUT 10 includes CMOS transistors designed to work at 5 VDC (e.g., VDD to VSS), then amplitude A1 will be set to about 5 VDC. During signal pin testing, DUT 10 receives operating potential from PULSE 1. Thus, latch-up can only occur when PULSE 1 is "high".

Figure 1A:
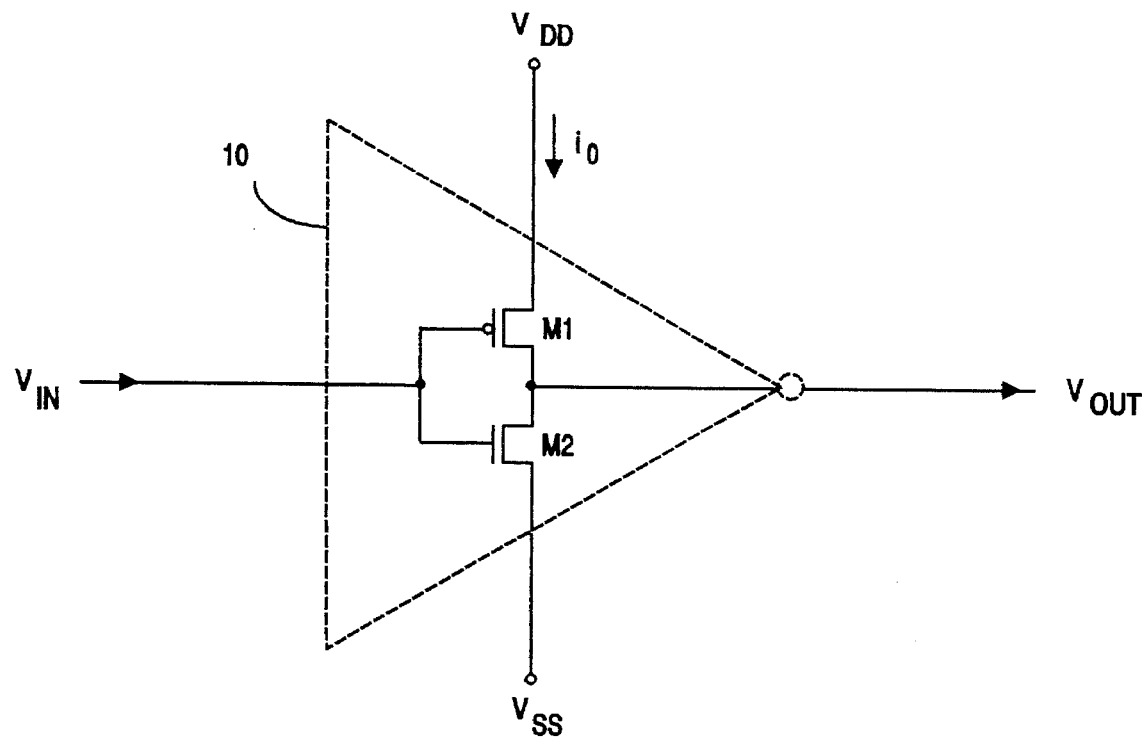
FIG. 1A depicts an example of a CMOS integrated circuit that is susceptible to latch-up damage, according to the prior art.
Figure 1B:
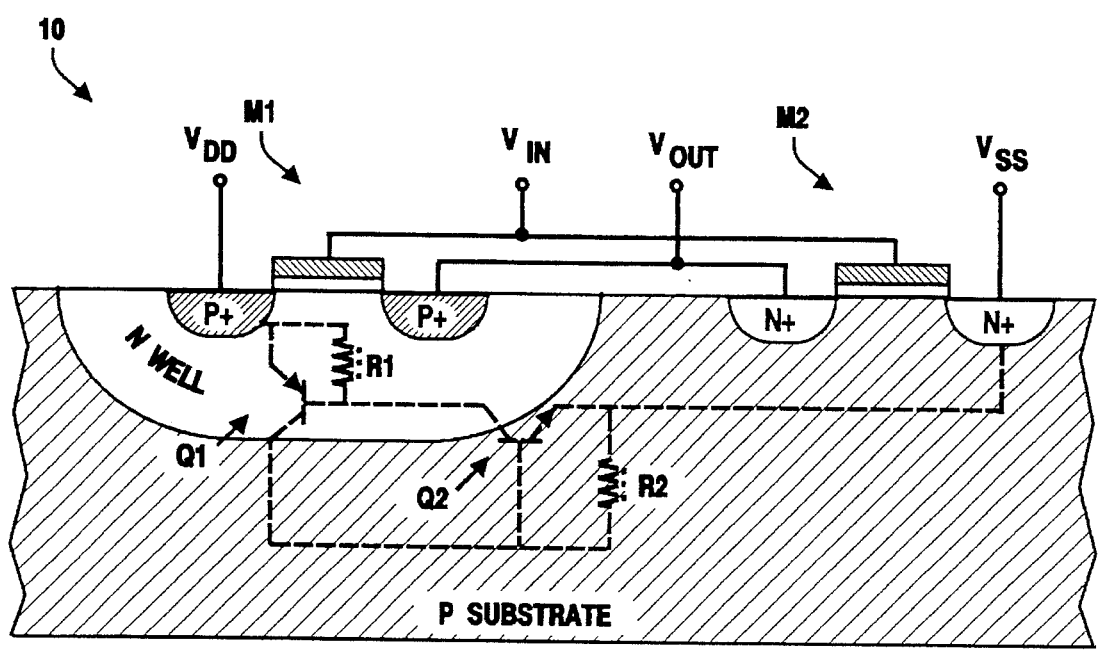
FIG. 1B is a cross-section of the semiconductor chip containing the IC of FIG. 1A, depicting parasitic bipolar transistors whose inherent presence can cause latch-up, according to the prior art.

Latch-up is triggered by the presence of the PULSE 2 trigger pulses, which pulses occur when PULSE 1 is high. After it begins, the latch-up phenomenon will terminate when the PULSE 1 signal returns to zero, as was described with respect to FIG. 1B. When PULSE 1 is at a "low" level, DUT 10 can cool down from the thermal heating effects of latch-up. For some CMOS devices 10 latch-up will be triggered on the rising edge of PULSE 2, and on other devices, triggering of latch-up will occur on the falling edge of PULSE 2.

If latch-up is triggered on the rising edge of PULSE 2, increasing pulse width T4 and/or increasing delay T5 will enhance the latch-up phenomenon, as will increasing the trigger pulse amplitude A2. If latch-up is triggered on the falling edge of PULSE 2, decreasing pulse width T4 and/or increasing delay T5 will enhance the latch-up phenomenon, as will increasing amplitude A2.

The present invention advantageously provides user control over pulse width T4, delay T5 and pulse amplitudes. In practice, it is convenient to initially use a relatively small delay T5, which delay is progressively increased until latch-up begins. Once latch-up begins, user variations in pulse width T4 and/or amplitude A2 may be made. Of course, delay T5 may also be varied. In this fashion evaluation of latch-up sensitivity may readily be accomplished with a great deal of flexibility and resolution.

As described earlier with respect to FIG. 1B, latch-up in DUT 10 is characterized by forward biased emitter-base junctions that emit photons. According to the present invention, the photon patterns preferably are examined with a conventional or generic emission microscope 50. Those skilled in the art will recognize that microscope 50 generally includes a charge-coupled-device ("CCD") type camera for recording the emission patterns. An oscilloscope 60 may also be coupled to the PULSE 1, PULSE 2 signals to aid in the use of the system, and a current probe 70 may be coupled from PULSE 1 to oscilloscope 60 as well.

Understandably, the surface of DUT 10 must be in view of the emission microscope 50. As such, DUT 10 may be on a wafer, or may be a finished IC that has not undergone completion of packaging. If packaging is complete, the upper portion of the package may be removed for latch-up testing of DUT 10.

Generator 20 preferably includes user switches or controls SW1–SW6 and SW9, permitting digital control over the pulse width T4 of PULSE 2, as well as the delay time T5 between the end of PULSE 2 and the end of PULSE 1. Generator 20 also includes user switches or controls SW7, SW8, and SW10 for controlling the mode of the two pulse trains, and for superimposing the pulse trains to create a composite third pulse train for power pin testing.

Figure 2B:
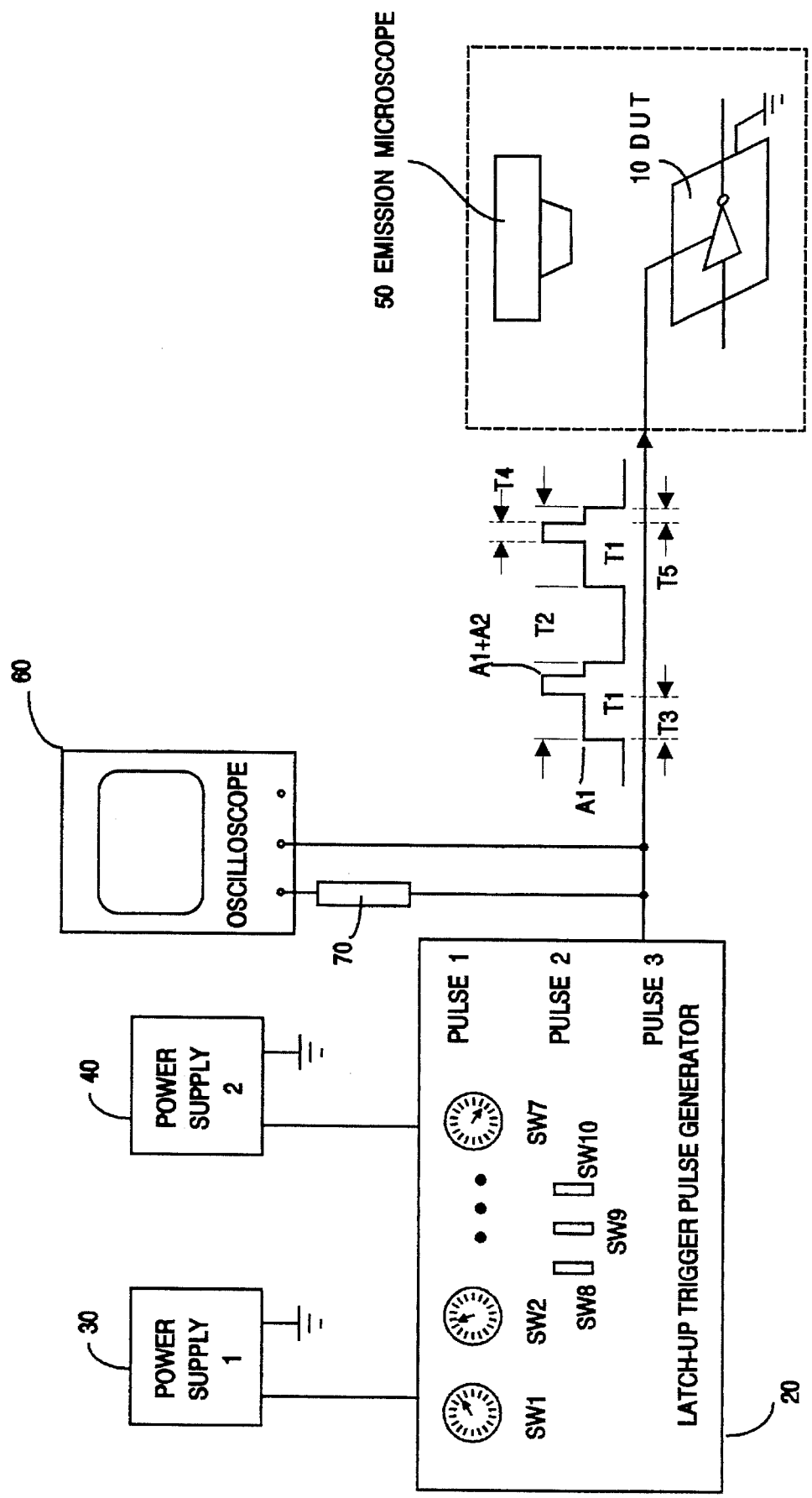
FIG. 2B is a block diagram of a latch-up pulse generator system outputting a composite third pulse train for power pin testing, according to the present invention.

FIG. 2B is similar to FIG. 2A except that a composite pulse train PULSE 3 is now generated by pulse generator 20, and is coupled to the power pin of the CMOS DUT 10 for power pin testing. The composite pulse train has a first amplitude level A1 that typically approximates the nominal operating voltage of DUT 10 (e.g., perhaps 5 VDC), and a higher second amplitude level A1+A2, of pulse width duration T4. Amplitude A1 is set by varying power supply 30, and amplitude A2 is set by varying power supply 40.

In the configuration of FIG. 2B, power pin latch-up is triggered by the presence of the second amplitude level, A1+A2, which level has a pulse width T4. Similar to what was described above, the present invention permits the user to adjust trigger pulse width T4, delay T5, as well as amplitudes A1 and A2. The resultant flexibility allows latch-up sensitivity to be readily evaluated, again using a generic emission microscope 50.

Figure 3:
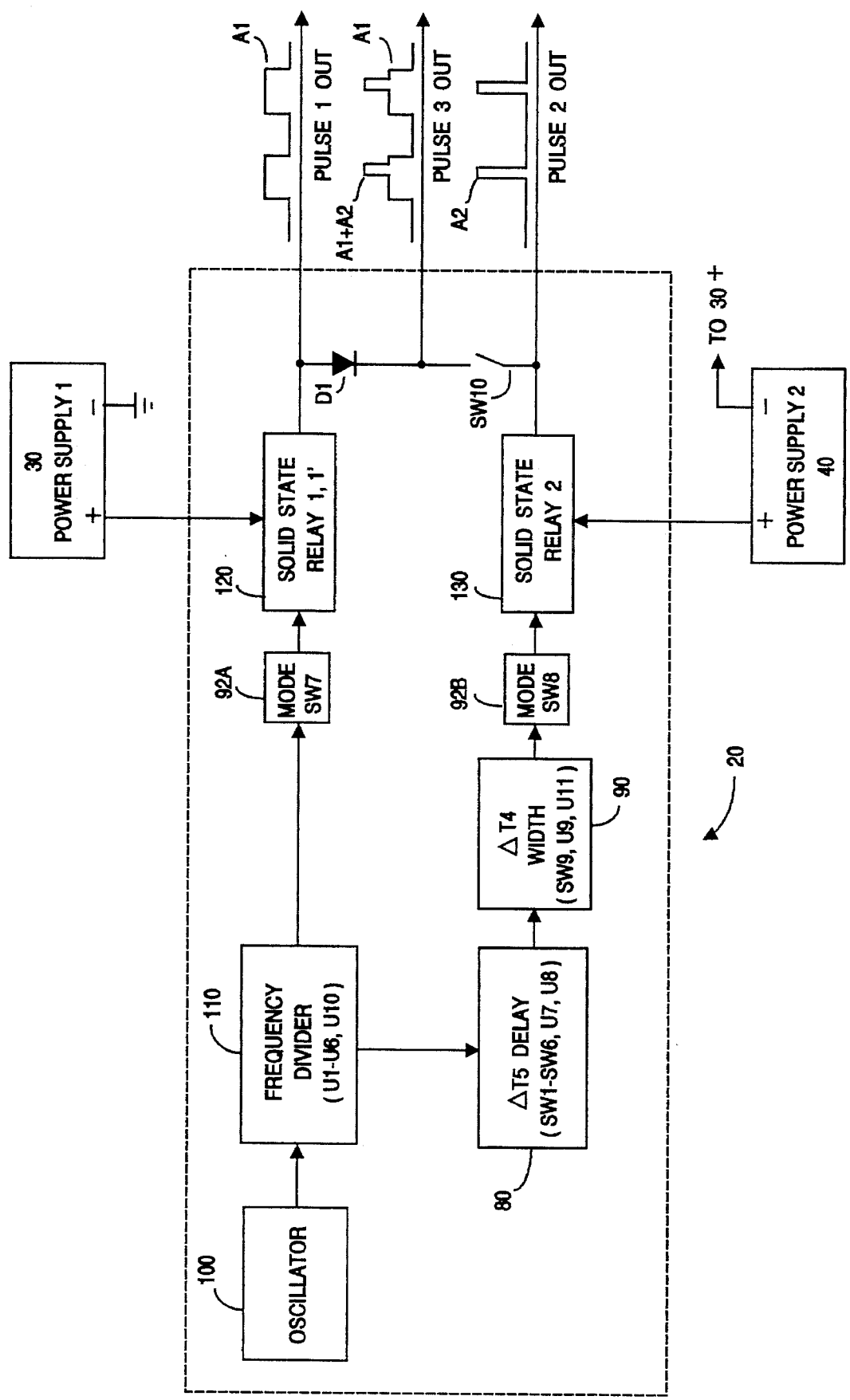
FIG. 3 is a block diagram of a latch-up pulse generator, according to the present invention.
Figure 4:
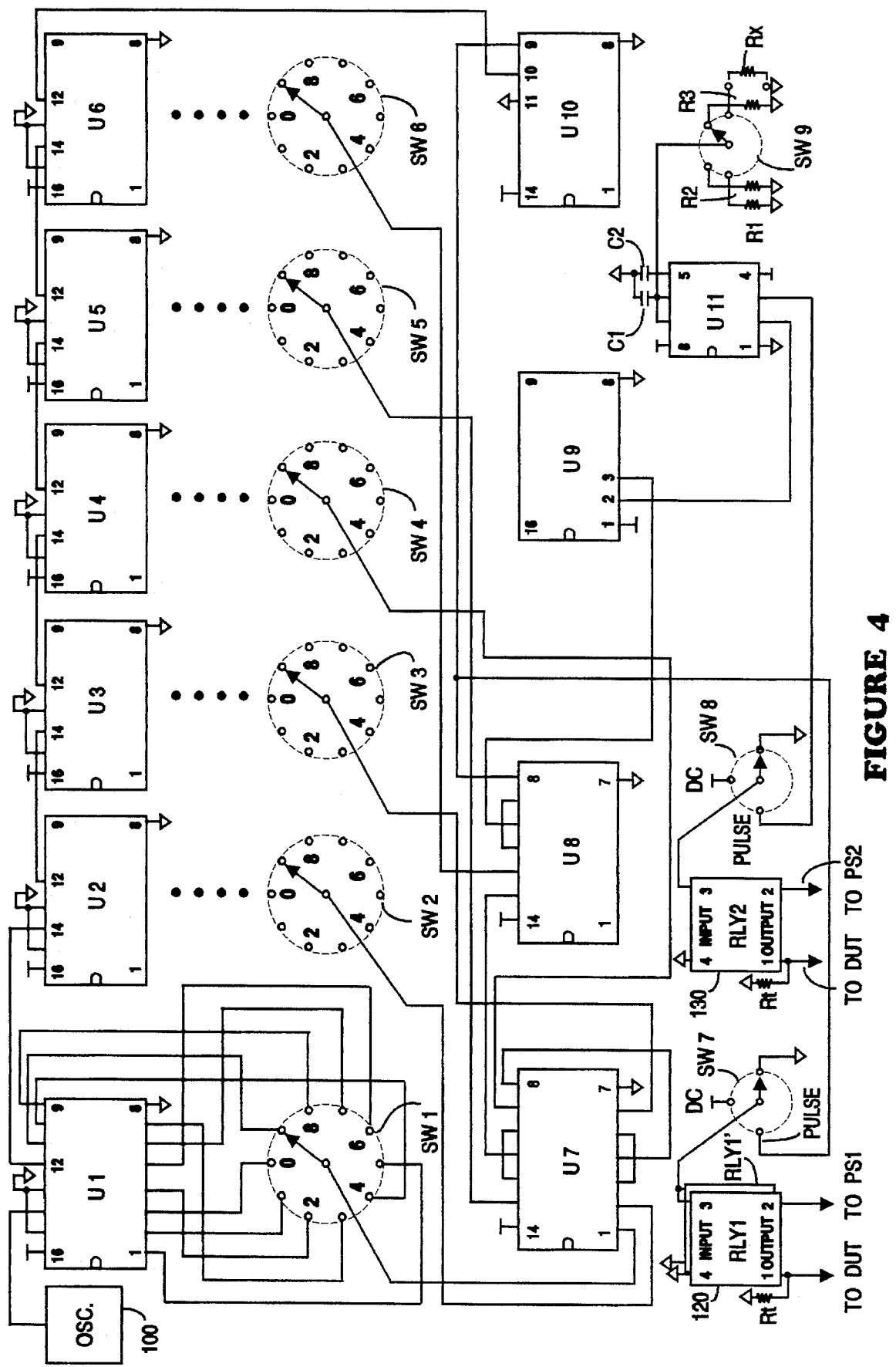
FIG. 4 is a schematic diagram of a preferred embodiment of a latch-up pulse generator, according to the present invention.

FIG. 3 is a block diagram of a preferred embodiment of generator 20, a schematic for which appears as FIG. 4. FIG. 3 also depicts one method of generating the composite power-pin testing pulse train PULSE 3.

A master oscillator 100, preferably a generic-type crystal controlled clock oscillating at about 1 MHz, e.g., with a period $T_o$ of 1 µs, provides a precision pulse train to a digital frequency divider 110. As will be seen with reference to FIG. 4, frequency divider unit 110 comprises ICs denoted U1–U6 and U10. In the embodiment of FIG. 4, ICs U1–U6 are 4017-type decade counters, preferably implemented in CMOS for low power consumption. IC U10 is a 4040-type 12-stage binary counter.

Collectively, U1–U6 and U10 (e.g., unit 110 in FIG. 3) frequency divides the crystal controlled 1 MHz signal by 2,000,000 and provides a substantially 50% duty cycle square-wave whose period Ti+T2 is 2.0 seconds (see FIG. 2). By "substantially 50% duty cycle" it is meant that the duty cycle is provided by a flip-flop whose output waveform ideally is 50%, but in practice may deviate from 50% very slightly (e.g., perhaps a few percent) in that it is impossible to realize an ideal flip-flop in practice. A 1.0 second "low" portion of the PULSE 1 waveform advantageously provides adequate time during which the DUT 10 can cool down from any latch-up phenomenon, before the next latch-up is induced by the trigger pulse, PULSE 2. ICs U10 and U8 cause PULSE 2 to have a two second, rather than one second, repetition rate since there is no need for a PULSE 2 trigger pulse when the PULSE 1 signal is "low".

In FIG. 4, mode switch SW7 (92A) determines whether the 2.0 second period square-wave is input to a solid state relay 120, or whether what is input to the relay shall be ground or a DC voltage. In the ground position, SW7 terminates latch-up testing because PULSE 1 is always "low". In the DC voltage position, SW7 presents a nominal power supply voltage, e.g., VCC~5.0 VDC, to the power pin of DUT 10. Of course, in the pulse mode, SW7 permits normal latch-up testing to occur. Relay 120 preferably comprises a parallel-coupled pair of solid state relays (relay 1, relay 1'), to boost current handling capability. The output of relay 120 is switchably coupled to the first power supply 30 in response to the mode-switch determined input to the relay.

As shown by the waveforms in FIG. 2A, the output from relay 120 is the first pulse train (PULSE 1). The amplitude A1 of this pulse train is determined by the amplitude of the first power supply 30, and will typically be the nominal DC operating voltage for CMOS DUT 10.

As best seen in FIG. 4, frequency divider 110 also outputs pulse signals of different repetition rates to a group of preferably ten-position switches denoted SW1–SW6. For ease of illustration, the wiring of switches SW2–SW6 is not shown in FIG. 4. However, switches SW2–SW6 are coupled to their respective decade counters U2–U6 in the same manner that switch SW1 is coupled to its associated decade counter U1.

With reference to FIG. 3, the time delay T5 between the falling edge of the trigger pulse (PULSE 2) and the falling edge of PULSE 1 is determined by a delay module 80. Delay module 80 includes user switches SW1–6, and ICs U7 and U8. A pulse width module 90 that includes user switch SW9, and ICs U9 and U11 determines the trigger pulse width, T4.

As further shown in FIG. 3, the power pin composite signal PULSE 3 may be generated simply by superimposing PULSE 1 and PULSE 2. Superimposition may be accomplished in several ways, including for example coupling the negative terminal of power supply 40 to the positive terminal of power supply 30. User operated switch SW10 (or the equivalent) may be used to select this mode, and a diode D1 may be used to protect power supply 30. As shown in FIG. 2B, the resultant composite pulse train (PULSE 3) is coupled to the power pin of a CMOS DUT 10 for power pin latch-up testing.

As seen in FIG. 4, ICs U7, U8 and U9 are coupled to the switching pole of SW1–SW6. Preferably U7 and U8 are 4081-type quad AND gates, whereas U9 performs an inverter function and is preferably a 4049-type hex inverting buffer unit, only one gate of which is used.

By switching various combinations of SW1–SW6, the delay time T5 (see waveforms in FIGS. 2A and 2B) between the falling edge of PULSE 2 and the falling edge of PULSE 1 may be set with approximately 1.0 µs resolution at any value between 1.0 µs and one second. Of course, greater resolution and/or range may be attained, for example by using a faster master oscillator 100, by using divide stages in frequency divider 110, among other solutions.

The PULSE 2 pulse width T4 (see waveforms in FIGS. 2A and 2B) is determined by SW9 and IC U11, preferably a generic 555-type monostable IC. Using values of C1, C2, R1, R2, R3 1.0 µf, 0.01 µf, 100Ω, 500Ω, 1 KΩ respectively, T4 may be set to provide a pulse width of 0.2 µs, 0.5 µs, 1.5 µs.

In the preferred embodiment, SW9 permits switching to a pair of pins into which a user-selected resistor Rx may be plugged, to provide any other desired T4 pulse width.

Of course, other pulse widths including a greater number of pulse width selections may be generated by providing SW9 with more than three switch positions, and by providing more and/or other values for these timing capacitors and resistors.

As shown in FIGS. 3 and 4, a mode switch SW8 (92B) is coupled in series between the output of the pulse width module 90 and the input to a solid state relay 130 whose output is switchably coupled to the second power supply 40.

To recapitulate, as seen in FIG. 2A and FIG. 4, for latch-up signal pin testing PULSE 1 is coupled to the power supply pin of CMOS DUT 10, and PULSE 2 is coupled to an input, output, or input/output pin of DUT 10. For power pin latch-up test, composite pulse train PULSE 3 is coupled to the power pin of CMOS DUT 10 (e.g., by closing SW10 and floating power supply 40 relative to power supply 30). It is further understood that the present embodiment may readily be fabricated as a self-contained, stand-alone unit, constructed, for example, on a single printed circuit board. Such embodiment could, if desired, even include units comprising the first and second power supplies, as opposed to including ports coupleable to external, preferably off-the-shelf generic first and second power supplies.

A user of the present invention may wish to start latch-up testing using a less than maximum voltage amplitude for PULSE 1 and PULSE 2. The pulse width T4 and delay time T5 of the waveforms (see FIG. 2) may then be adjusted for onset of latch-up, by means of switches SW1-7. Emission microscope 50 may be used to detect latch-up.

Those skilled in the art will appreciate that onset of signal pin latch-up will occur within the time T4+T5 or the time T5, depending upon whether the rising or falling edge of PULSE 2 triggers latch-up. In either instance, latch-up commences while PULSE 1 is "high" and will terminate when PULSE 1 goes "low".

Because the present invention provides precise control over times T4 and T5, a high degree of repeatability exists. The onset and progression of latch-up damage within DUT 10 may be controlled to provide insight into redesigning DUT 10 to minimize such damage. Further, the high degree of user control permits testing DUT 10 and halting progression of latch-up damage before destroying DUT 10.

In summation, the present invention offers many advantages over prior art techniques for investigating latch-up in CMOS devices. Power pin and signal pin testing are provided by a self-contained system that can be implemented for hundreds rather than thousands of dollars. Further, because of the repeatability afforded by the present invention, analysis of onset and progression of latch-up damage may be made using a generic emission microscope.

Modifications and variations may be made to the disclosed embodiments without departing from the subject and spirit of the invention as defined by the following claims.

What is claimed is:

1. A generator system for controllably inducing power pin latch-up and signal pin latch-up in a CMOS device under test, the system comprising:

an oscillator providing an oscillator signal;

a frequency divider, coupled to said oscillator to receive and frequency-divide said oscillator signal to provide therefrom an internal first pulse signal having a first period substantially exceeding a period of said oscillator signal;

delay circuitry, coupled to said frequency divider, to provide an internal second pulse signal whose period substantially equals said first period and whose pulse width is less than about 50% of said first period and whose pulse onset is delayable relative to onset on said terminal first pulse signal; and delay circuitry including switch circuitry enabling user selection of said pulse width of said internal second pulse signal and of delay between onset of said internal second pulse signal and onset of said internal first pulse signal;

first switching means, having an input port coupled to said internal first pulse signal, and having an output port coupleable, in response to a voltage state of said internal first pulse signal, to a first power supply of user-selectable amplitude A1, for providing a first output pulse train of amplitude A1 in response to said internal first pulse signal;

second switching means, having an input port coupled to said internal second pulse signal, and having an output port coupleable, in response to a voltage state of said internal second pulse signal, to a second power supply of user-selectable amplitude A2, for providing a second output pulse train of amplitude A2 in response to said internal second pulse signal; and means for superimposing said first output pulse train and said second output pulse train to provide composite third output pulse train;

wherein during power pin latch-up testing, said composite third output pulse train is coupled to a power pin on said CMOS device under test;

wherein during signal pin latch-up testing, said first output pulse train is coupled to a power pin on said CMOS device under test, and said second output pulse train is coupled to a pin on said CMOS device under test selected from the group consisting of (a) an input pin, (b) an output pin, and (c) and input/output pin; and wherein while said generator system is used to test said CMOS device, a user may vary pulse width of said internal second pulse signal, delay between onset of said internal second pulse signal and onset of said internal first pulse signal, amplitude A1, amplitude A2, or any combination thereof.

2. The generator system of claim 1, wherein said internal first pulse signal has at least one characteristic selected from the group consisting of (i) a duty cycle of substantially 50%, and a first period of about two seconds.

3. The generator system of claim 1, wherein said oscillator signal has a period of about 1 μs.

4. The generator system of claim 1, wherein said switch circuitry and said delay circuitry permit user-selection of said pulse width of said internal second pulse signal over a range of about 0.2 μs to about 5 μs.

5. The generator system of claim 1, wherein said switch circuitry and said delay circuitry permit user-selection of said delay between onset of said internal second pulse signal and onset of said internal first pulse signal over a range of about 1 μs to about one second.

6. The generator system of claim 1, wherein said oscillator signal has a frequency sufficiently higher than a frequency of said internal first pulse signal enabling said delay circuitry and said switch circuitry to control said delay between onset of said internal second pulse signal and onset of said internal first pulse signal in increments of about 1 μs.

7. The generator system of claim 1, further including an emission microscope, operated in a mode electrically unsynchronized to any pulse train provided by said generator system, positioned to view latch-up caused emissions in said CMOS device under test.

8. The generator system of claim 1, wherein at least one of said first output pulse train and said second output pulse train has an amplitude of 15 VDC and delivers about 5 A current to said CMOS device under test.

9. The generator system of claim 1, wherein said means for superimposing includes a user-operated switch causing said second power supply to output a voltage whose magnitude floats on a voltage magnitude output from said first power supply.

10. The generator system of claim 1, wherein at least one of said first switching means and said second switching means includes a relay.

11. The generator system of claim 1, wherein said generator system is fabricated as a stand-alone unit.

12. The generator system of claim 1, wherein each of said first output pulse train, said second output pulse train, and said composite output third pulse train complies with JEDEC "IC latch-up Test" standard protocol.

13. A stand-alone generator system for controllably inducing power pin latch-up and signal pin latch-up in a CMOS device under test, the system comprising:

an oscillator providing an oscillator signal having a signal period;

a frequency divider, coupled to said oscillator to receive and frequency-divide said oscillator signal to provide therefrom an internal first pulse signal having a first period, said internal first pulse signal having at least one characteristic selected from the group consisting of (a) said internal first pulse signal has a duty cycle of substantially 50%, (b) said internal first pulse signal has a first period of about two seconds, and (c) said internal first pulse signal period is less than said signal period by a factor of at least 100,000;

delay circuitry, coupled to said frequency divider, to provide an internal second pulse signal whose period substantially equals said first period and whose pulse width is less than about 50% of said first period and whose pulse onset is delayable relative to onset of said internal first pulse signal; said delay circuitry including switch circuitry enabling user selection of said pulse width of said internal second pulse signal and of delay between onset of said internal second pulse signal and onset of said internal first pulse signal;

first switching means, having an input port coupled to said internal first pulse signal, and having an output port coupled to a first power supply of user-selectable train an amplitude A1 in response to said internal first pulse signal;

second switching means, having an input port coupled to said internal second pulse signal, and having an output port coupled to a second power supply of user-selectable amplitude A2, for providing second output pulse train of amplitude A2 in response to said internal second pulse signal; and means for superimposing said first output pulse train and said second output pulse train to provide composite third output pulse train;

wherein during power pin latch-up testing, said composite third output pulse train is coupled to a power pin on said CMOS device under test, wherein during signal pin latch-up testing, said first output pulse train is coupled to a power pin on said CMOS device under test, and said second output pulse train is coupled to a pin on said CMOS device under test selected from the group consisting of (a) an input pin, (b) an output pin, and (c) and input/output pin; and wherein while said generator system is used to test said CMOS device, a user may vary pulse width of said internal second pulse signal, delay between onset of said internal second pulse signal and onset of said internal first pulse signal, amplitude A1, amplitude A2, or any combination thereof.

14. The generator system of claim 13, wherein said switch circuitry and said delay circuitry permit user-selection of said pulse width of said internal second pulse signal over a range of about 0.2 μs to about 5 μs.

15. The generator system of claim 13, wherein said switch circuitry and said delay circuitry permit user-selection of said delay between onset of said internal second pulse signal and onset of said internal first pulse signal over a range of about 1 μs to about one second in increments of about 1 μs.

16. The generator system of claim 13, further including an emission microscope, operated in a mode electrically unsynchronized to any pulse train provided by said generator system, positioned to view latch-up caused emissions in said CMOS device under test.

17. The generator system of claim 13, wherein said means for superimposing includes a user-operated switch causing said second power supply to output a voltage whose magnitude floats on a voltage magnitude output from said first power supply.

18. The generator system of claim 13, wherein at least one of said first switching means and said second switching means includes a solid-state relay.

19. The generator system of claim 13, wherein each of said first output pulse train, said second output pulse train, and said composite third output pulse train complies with JEDEC "IC Latch-up Test" standard protocol.

20. The generator system of claim 13, wherein at least one of said first output pulse train and said second output pulse train has an amplitude of 15 VDC and delivers about 5 A current to said CMOS device under test.

21. A waveform superimposing circuit for use with a generator system that controllably induces at least signal pin latch-up in a CMOS device under test, the generator system having an oscillator providing an oscillator signal, a frequency divider coupled to said oscillator to receive and frequency-divide said oscillator signal and to provide therefrom an internal first pulse signal having a first period substantially exceeding a period of said oscillator signal, means coupled to said frequency divider for generating an internal second pulse signal whose period substantially equals said first period and whose pulse width is less than about 50% of said first period and whose pulse onset is delayable relative to onset of said internal first pulse signal first means having an input port coupled to said internal first pulse signal and having an output port coupleable to a first power supply of user-selectable amplitude A1 for providing a first output pulse train of amplitude A1 in response to said internal first pulse signal and second means having an input port coupled to said internal second pulse signal and having an output port coupleable to a second power supply of user-selectable amplitude A2 for providing a second output pulse train of amplitude A2 in response to said internal second pulse signal, wherein during signal pin latch-up testing, said first output pulse train is coupled to a power pin on said CMOS device under test, and said second output pulse train is coupled to a pin on said CMOS device under test selected from the group consisting of (a) an input pin, (b) an output pin, and (c) and input/output pin;

the waveform superimposing circuit comprising:
means for superimposing said first output pulse train and said second output pulse train to provide a composite third output pulse train; and
mode means for causing said means for superimposing to provide said third output pulse train when said system is in a power pin latch-up test mode;
wherein in said power pin latch-up test mode, said composite third output pulse train is coupled to a power pin on said CMOS device under test to enable said generator system to conduct power pin latch-up testing.

\* \* \* \* \*